(12) United States Patent
Tam et al.

(10) Patent No.: US 9,678,442 B2
(45) Date of Patent: Jun. 13, 2017

(54) AERIAL MASK INSPECTION BASED WEAK POINT ANALYSIS

(71) Applicant: Applied Materials Israel, Ltd., Rehovot (IL)

(72) Inventors: Aviram Tam, Nes Ziona (IL); Lei Zhong, Parker, TX (US)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 89 days.

(21) Appl. No.: 14/706,780

(22) Filed: May 7, 2015

(65) Prior Publication Data
US 2015/0346610 A1    Dec. 3, 2015

Related U.S. Application Data

(60) Provisional application No. 62/003,720, filed on May 28, 2014.

(51) Int. Cl.
  *G03F 7/20*   (2006.01)
  *G03F 1/84*   (2012.01)

(52) U.S. Cl.
  CPC ............ *G03F 7/70666* (2013.01); *G03F 1/84* (2013.01); *G03F 7/70558* (2013.01); *G03F 7/70641* (2013.01)

(58) Field of Classification Search
  CPC .... G03F 7/70666; G03F 1/84; G03F 7/70558; G03F 7/70641
  See application file for complete search history.

(56) References Cited

U.S. PATENT DOCUMENTS

| | | | | |
|---|---|---|---|---|
| 6,777,147 B1 * | 8/2004 | Fonseca | ............... | G03F 7/70466 430/30 |
| 2006/0136862 A1 * | 6/2006 | Nojima | ............... | G06F 17/5068 716/52 |
| 2006/0234139 A1 * | 10/2006 | Watson | ..................... | G03F 1/72 430/5 |
| 2006/0291714 A1 * | 12/2006 | Wu | .................. | G01N 21/95607 382/149 |
| 2007/0035712 A1 * | 2/2007 | Gassner | ............. | G03F 7/70666 355/55 |
| 2011/0172804 A1 * | 7/2011 | Park | .................... | G03F 7/70516 700/110 |
| 2016/0103946 A1 * | 4/2016 | El Kodadi | ......... | G01N 21/4785 716/51 |

* cited by examiner

*Primary Examiner* — David F Dunphy
(74) *Attorney, Agent, or Firm* — Kilpatrick Townsend & Stockton LLP

(57) ABSTRACT

An analysis system that includes a processor and an memory module; wherein the memory module is arranged to store aerial images of an area of a mask, each aerial image corresponds to focus value out of a set of different focus values; wherein the processor is arranged to find weak points by processing the aerial images using different printability thresholds; and wherein the processor is arranged to determine focus and exposure values for generating a Process Window Qualification (PWQ) wafer to be manufactured using the mask in response to focus and exposure values associated with the weak points.

20 Claims, 8 Drawing Sheets

AERIAL MASK INSPECTION BASED WEAK POINT ANALYSIS

CROSS-REFERENCE TO RELATED APPLICATIONS

The present application claims priority to U.S. Provisional Application No. 62/003,720, filed May 28, 2014, which is incorporated herein by reference in its entirety for all purposes.

BACKGROUND

The main process in fabrication of silicon chips is photolithography. Photolithography is a process of imaging a desired pattern on a silicon wafer coated with a photoresist material. This is achieved using a quartz plate (mask) on which a desired pattern is printed. A light (typically a 193 nm laser or an Extreme Ultra Violet laser) is projected through the mask traveling through specialized optics that images the desired pattern at wafer plane on the photoresist. Each mask used is designed in such a way that slight changes in photolithography conditions (typically laser dose and defocus) still provide the desired pattern up to a certain tolerance. The extent of defocus and dose change that still provide the desired pattern up to a specified tolerance is referred to as process window.

During the photolithography process in the wafer fabrication facilities (fabs) following issues may occur:
a. The actual process window of the mask is less than what it was designed for (mask fabrication issue, design error, OPC modeling error, etc.).
b. After a certain number of mask exposures (to laser) mask goes through physical change that decrease the process window size. This can be due to oxidation, Crystal growth, pellicle degradation, etc.
c. When a mask returns from cleaning to production, the process window is decreased. (cleaning induced degradation)

As a result of this reduction in process window certain layout segments may be printed in an erroneous way which may in turn lead to device failure.

The main challenge is in identifying all locations with high risk of erroneous wafer print.

SUMMARY

According to an embodiment of the invention there may be provided methods, systems and non-transitory computer readable medium that may store instructions for executing the methods.

According to an embodiment of the invention there may be provided a non-transitory computer readable medium that may store instructions for obtaining aerial images of an area of a mask, each aerial image corresponds to a focus value out of a set of different focus values; finding weak points by processing the aerial images using different printability thresholds; and determining focus and exposure values for generating a Process Window Qualification (PWQ) wafer to be manufactured using the mask in response to focus and exposure values associated with the weak points.

The non-transitory computer readable medium may store instructions for applying a metrology process on a Focus Exposure Matrix (FEM) wafer that was manufactured using an initial set of focus and exposure values; and wherein the determining of focus and exposure values for generating the PWQ wafer are further responsive to the metrology results of the FEM wafer.

The non-transitory computer readable medium may store instructions for updating at least one of an inspection recipe and a review recipe in view of at least the weak points.

The non-transitory computer readable medium may store instructions for inspecting the PWQ wafer to provide PWQ inspection results.

The non-transitory computer readable medium may store instructions for selecting suspected defects to be reviewed out of all the suspected defects that were detected during the PWQ inspection by reviewing the aerial images at locations identified by the PWQ inspection results.

The non-transitory computer readable medium may store instructions for responding to the PWQ inspection results.

The non-transitory computer readable medium may store instructions for selecting suspected defects to be reviewed out of all the suspected defects that were detected during the PWQ inspection.

The non-transitory computer readable medium may store instructions for reviewing at least some of suspected defects detected during the PWQ inspection results.

The non-transitory computer readable medium may store instructions for classifying defects found during the reviewing.

The non-transitory computer readable medium may store instructions for updating at least one out of an inspection recipe, weak point recipe and a review recipe in view of the reviewing.

The non-transitory computer readable medium may store instructions for updating weak points to be examined by a next PWQ wafer.

The non-transitory computer readable medium may store instructions for updating at least one out of an inspection recipe, weak point recipe and a review recipe in view of the PWQ inspection results.

The non-transitory computer readable medium may store instructions for determining focus and exposure values for generating a next PWQ wafer.

The non-transitory computer readable medium may store instructions for evaluating a state of the mask.

The non-transitory computer readable medium may store instructions for scheduling a manufacturing of a next PWQ wafer.

The printability of a photoresist is defined by a printability function; wherein elements of an expected image that have an intensity that is located at one side of a printability function result in a development of the photoresist; wherein elements of the expected image that have an intensity that is located at a second side of the printability function do not result in a development of the photoresist; wherein a lithography process exhibits a process window of allowable lithography process conditions; wherein different allowable lithography process conditions introduce allowable changes at pixels of the expected image, the allowable changes do not exceed an intensity threshold; and wherein each weak point fulfilling at least one condition out of (a) being a local extremum point of the aerial image that is spaced apart from the printability function by an intensity difference that does not exceed the intensity function; (b) being a crossing point of the printability function and being of a slope that is below a predefined threshold; (c) rapidly changing intensity through focus.

The values of the printability function may be location dependent.

Each weak point is a local extremum point of the aerial image that is spaced apart from the printability threshold by a distance that does not exceed the intensity threshold.

The non-transitory computer readable medium may store instructions for obtaining aerial images of the at least one weak point; wherein the obtaining is triggered in response to at least one of an occurrence of a process window affecting event and a lapse of a predefined period; and detecting a mask error if a weak point has moved from one side of the printability function to another side of the printability threshold.

The non-transitory computer readable medium may store instructions for finding the weak points by processing the aerial images based on a printability function of a photoresist to provide multiple binary images; wherein different binary images represent different combinations of a threshold and a lithography process conditions; wherein each of the at least one threshold is determined based on a printability function of the photoresist; and searching for at least one weak point based upon differences between at least two binary images.

The non-transitory computer readable medium may store instructions for thresholding the aerial images by at least one threshold to provide the multiple binary images; and searching for the at least one weak point based upon differences between at least two binary images.

The non-transitory computer readable medium may store instructions for thresholding the aerial images by multiple thresholds to provide multiple binary images; wherein the multiple thresholds are determined based on the printability threshold of the photoresist; and searching for at least one weak point based upon differences between at least two binary images.

The aerial images may be actual aerial images, calculated aerial images, simulated aerial images or a combination thereof.

According to an embodiment of the invention there may be provided an inspection system that may include an image obtaining module that is arranged to obtain an aerial image of an area of a mask; wherein the aerial image represents an expected image to be formed on a photoresist of an object during a lithography process that involves illuminating the area of the mask, by a lithography tool; wherein the photoresist has a printability threshold; wherein elements of the expected image that have an intensity that is located at one side of a printability threshold result in a development the photoresist; wherein elements of the expected image that have an intensity that is located at a second side of the printability threshold do not result in a development of the photoresist; wherein the lithography process exhibits a process window of allowable lithography process conditions; wherein different allowable lithography process conditions introduce allowable changes at pixels of the expected image, the allowable changes do not exceed an intensity threshold; and a processor that is arranged to search for at least one weak point at the area of the mask, each weak point fulfilling at least one condition out of (a) being a local extremum point of the aerial image that is spaced apart from the printability threshold by a distance that does not exceed the intensity threshold; (b) rapidly changing intensity through focus; (c) being a crossing point of the printability threshold and being of a slope that is below a predefined threshold.

Each weak point may be a local extremum point of an aerial image that is spaced apart from the printability threshold by a distance that does not exceed the intensity threshold.

The image obtaining module may be arranged to obtain aerial images of the at least one weak point; wherein the aerial images are obtained due to at least one of an occurrence of a process window affecting event and a lapse of a predefined period; and wherein the processor is arranged to detect a mask error if a weak point has moved from one side of the printability threshold to another side of the printability threshold.

The image obtaining module is arranged to obtain aerial images of the at least one weak point; wherein the aerial images are obtained due to at least one of an occurrence of a process window affecting event and a lapse of a predefined period; and the processor is arranged to detect a mask error if weak points have moved from one side of the printability threshold to another side of the printability threshold to cause two spaced apart photoresist patterns to connect each other.

The image obtaining module may be arranged to obtain aerial images of the at least one weak point; wherein the aerial images are obtained due to at least one of an occurrence of a process window affecting event and a lapse of a predefined period; and wherein the processor is arranged to detect a mask error if weak points have moved from one side of the printability threshold to another side of the printability threshold such as to convert a continuous photoresist pattern to be split to multiple photoresist patterns.

The processor may be arranged to obtain multiple aerial images of the area of the mask under different simulated lithography process conditions.

According to an embodiment of the invention there may be provided a method for weak point based analysis, the method may include obtaining, aerial images of an area of a mask, each aerial image corresponds to a focus value out of a set of different focus values; finding weak points by processing the aerial images using different printability thresholds; and determining focus and exposure values for generating a Process Window Qualification (PWQ) wafer to be manufactured using the mask in response to focus and exposure values associated with the weak points.

The method may include applying a metrology process on a Focus Exposure Matrix (FEM) wafer that was manufactured using an initial set of focus and exposure values; and wherein the determining of the focus and exposure values for generating the PWQ wafer are further responsive to the metrology results of the FEM wafer.

According to an embodiment of the invention there may be provided an analysis system that may include a processor and an memory module; wherein the memory module is arranged to store aerial images of an area of a mask, each aerial image corresponds to focus value out of a set of different focus values; wherein the processor is arranged to find weak points by processing the aerial images using different printability thresholds; and wherein the processor is arranged to determine focus and exposure values for generating a Process Window Qualification (PWQ) wafer to be manufactured using the mask in response to focus and exposure values associated with the weak points.

BRIEF DESCRIPTION OF THE DRAWINGS

Further details, aspects and embodiments of the invention will be described, by way of example only, with reference to the drawings. In the drawings, the same reference numbers are used to identify like or functionally similar elements. Elements in the figures are illustrated for simplicity and clarity and have not necessarily been drawn to scale.

DETAILED DESCRIPTION OF THE DRAWINGS

Figure 1:
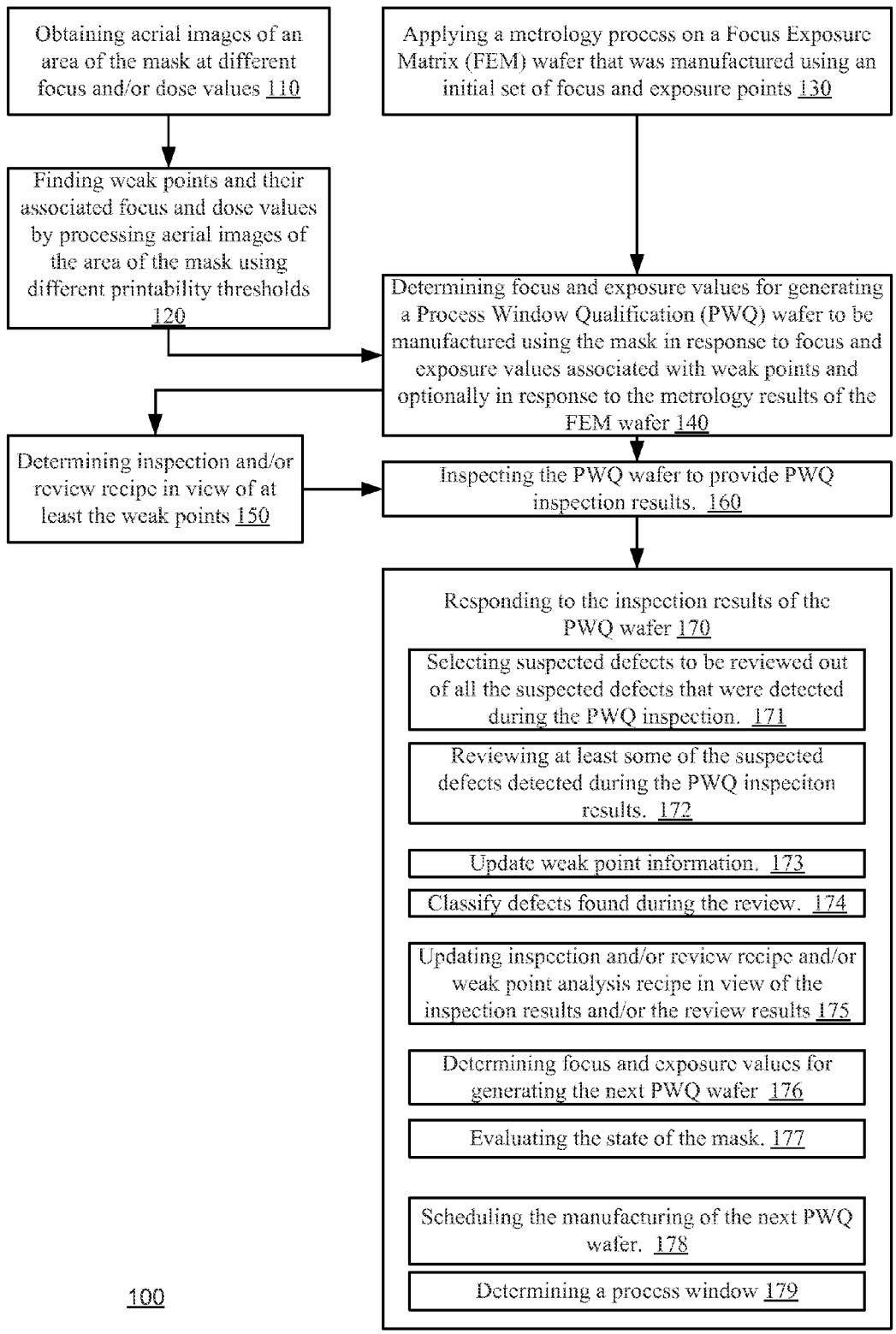
FIGS. 1-2 illustrate various methods according to various embodiments of the invention.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may, for the most part, be implemented using electronic components and modules known to those skilled in the art, details will not be explained in any greater extent than that considered necessary as illustrated above, for the understanding and appreciation of the underlying concepts of the present invention and in order not to obfuscate or distract from the teachings of the present invention.

The assignment of the same reference numbers to various components may indicate that these components are similar to each other.

The foregoing and other objects, features, and advantages of the present invention will become more apparent from the following detailed description when taken in conjunction with the accompanying drawings. In the drawings, similar reference characters denote similar elements throughout the different views.

Because the illustrated embodiments of the present invention may for the most part, be implemented using electronic components and circuits known to those skilled in the art, details will not be explained in any greater extent than that considered necessary for the understanding and appreciation of the underlying concepts of the present invention and in order not to obfuscate or distract from the teachings of the present invention.

There are provided systems, non-transitory computer readable mediums and methods for monitoring a mask. The monitoring utilizes aerial imaging in order to identify locations (weak points) that are at risk of being misprinted. These locations can be identified and monitored by acquiring aerial images of the mask and processing the aerial images of the mask while applying one or more criteria indicating risk of misprinting. These weak points can be fed to OPC models, process window qualification processes and can also be monitored during the lifespan of the mask and may provide a user with tools for early warning of circuit failure.

The provided systems, non-transitory computer readable mediums and methods provide a more accurate analysis and more realistic analysis of the state of the mask than Computer Aided Design (CAD) based solutions that simulate the initial (and even ideal) state of the mask.

Mask manufacturing variations as well as changes to the mask during its lifespan cannot be accurately modeled and thus the proposed systems, non-transitory computer readable mediums and methods can assist in analyzing, qualifying and monitoring real masks through their lifespan of the mask.

The provided systems, non-transitory computer readable mediums and methods may obtain an aerial image of an area of the mask that represents an expected image to be formed on a photoresist of an object during a lithography process that involves illuminating the area of the mask, by a lithography tool. The expected image is a continuous image and the aerial image can include samples (pixels) of the expected image. The sampling can be an outcome of using an image sensor of finite resolution. The sampling can result in generating an Aerial image that includes multiple pixels. It is assumed that the sampling is done in a manner that guarantees an accurate representation of the expected image. For example, the sampling can be done according to the Nyquist rule.

A printability threshold can provide a rough estimation of whether an element of the expected image will be printed on the photoresist. Especially, a comparison of to the printability threshold to an intensity of an element of the expected image can provide such rough estimation.

It is noted that the printability threshold is a non-limiting example of a printability function. The printability function can be linear or non-linear. The values of the printability function can change as a function of a location of the photoresist. Thus, some locations of the photoresist can have a printability value that differs from the printability value of other locations.

For simplicity of explanation the following text refers to a printability threshold.

The described methods, systems and non-transitory computer readable mediums can be applied mutatis mutandis on printability functions that differ from a printability threshold that is constant over the entire photoresist. Thus, instead of comparing a value of an element of an image to the fixed printability threshold, the value of the element is compared to a value of a printability function at a location that corresponds to the location of the element.

The described methods, systems and non-transitory computer readable mediums uses data obtained from the mask to change, modify and/or determine a PWQ setup, a wafer inspection recipe, a review recipe (including the sampling of suspected defects to be reviewed) thereby improving the PWQ process effectiveness and efficiency. The mask data may be used to evaluate and re-evaluate the status of the mask.

FIG. 1 illustrates method 100 according to an embodiment of the invention.

Stage 110 may include obtaining, for each focus value out of a set of different focus values (and/or for each combination of focus and dose values), an aerial image of an area of the mask. The aerial image represents an expected image to be formed on a photoresist of an object during a lithography process that involves illuminating the area of the mask, by a lithography tool.

The photoresist has a printability threshold. Pixels of the expected image that have an intensity that is located at one side of the printability threshold result in a development the photoresist. Pixels of the expected image that have an intensity that is located at a second side of the printability threshold do not result in a development of the photoresist.

The lithography process exhibits a process window of allowable lithography process conditions. Different allowable lithography process conditions introduce allowable changes at pixels of the expected image; the allowable changes do not exceed an intensity threshold.

The obtaining (stage 110) can include optically acquiring actual aerial images, for example by using an aerial imaging tool such as the AERA of Applied Materials Inc., California, US.

Additionally or alternatively, the obtaining can include retrieving an aerial image from an aerial tool or from any other storage entity. Additionally or alternatively, information from non-aerial images, for example based on high-resolution images, can be processed (calculated or simulated) to provide calculated or simulated aerial images. It is noted that stage 120 may include receiving computer aided design (CAD) information.

Stage 110 is followed by stage 120 of finding weak points and their associated focus and dose values by processing aerial images of the area of the mask using different printability thresholds. Finding of a weak point can include performing weak point as illustrated in U.S. patent application Ser. No. 13/895,584 which is incorporated herein by reference. The finding of weak points can be based, at least partially, on CAD information.

A weak point can be a local extremum point of the aerial image that is spaced apart from the printability threshold by a distance that does not exceed the intensity threshold.

Additionally or alternatively, the weak point can be a crossing point of the printability threshold and being of a slope that is below a predefined threshold.

Additionally or alternatively, the weak point can be a point whose aerial value is rapidly changing, above a certain threshold, through focus and is close to the printability threshold.

The searching can include scanning the entire aerial image, searching suspected weak point locations (such as patterns that are proximate to each other, this lines and the like), or a combination thereof.

According to an embodiment of the invention stage 120 may include searching for a weak point that is a local extremum point of the aerial image that is spaced apart from the printability threshold by a distance that does not exceed the intensity threshold.

According to an embodiment of the invention stage 120 includes searching for a weak point that is a local extremum point of the aerial image that is spaced apart from the printability threshold by a distance that does not exceed a sum of (a) the intensity threshold and (b) a safety distance.

The outcome of stage 110 and stage 120 can be a list (or other data structure) of weak points that can be used during the lifespan of the mask. The list (or any other data structure) may include the location of the weak points and the focus and exposure values associated with each weak point.

Stage 120 can be followed by stage (not shown) of evaluating a state of the mask based on an examination of the weak points.

Either one of stage 110, stage 120 and the evaluation of the state of the mask (denoted 177) can be triggered according to any of the following or a combination thereof:

a. A predefined timing scheme (once every predefined period),
b. According to a random or pseudo-random timing scheme,
c. Due to an occurrence of an event and the like. The event can be, for example, a cleaning session of a mask, reaching a certain amount of lithography iterations, a detection of errors in objects manufactured by the mask, a change in the process window, a change of the lithography process conditions, and the like.
d. The process may be executed when the mask is entirely new and when it was used for certain time periods. Thus—before or after the mask has undergone any degradation.

Another approach to identify weak points is to apply the printability threshold changes on an aerial image and comparing the binary images (denoted 322 in FIG. 3) resulting from the thresholding.

A location with high difference between binary images can be defined as a weak point. The definition of the weak point can take into account several attributes such as an area of differences, whether patterns that were spaced apart were merged, whether a pattern was split, and the like.

According to another embodiment of the invention weak points of a mask can be found by obtaining multiple binary images, each binary image may represent the expected image printed on a photoresist due to a unique combination of a threshold (illumination intensity) and lithography process conditions (such as focus).

Different binary images are compared to each other or to the binary image representing the nominal conditions (E.g. nominal focus and exposure combination) to locate differences between the binary images—differences related to the same locations of the mask.

Differences between the binary images (especially those contributed to the same locations) can indicate that weak point exists.

In other words—pixels of the binary images that do not substantially change due to different lithography process conditions (such as focus changes) and different thresholds will not be regarded as weak points.

Accordingly, stage 110 may include obtaining one aerial image or multiple aerial images. Different aerial images are expected to differ from each other by the lithography process conditions associated with these aerial images. For example—different aerial images can represent different focusing condition, different illumination intensity conditions and the like.

In this embodiment stage 120 may include thresholding the at least one aerial image by at least one threshold to provide multiple binary images. Thus, if only one aerial image is obtained during stage 120 then multiple different thresholds should be applied—each threshold may result in a different binary image. If, for example, multiple aerial images are provided then even a single threshold (per aerial image) can be used. It is noted that multiple aerial images can be obtained and each is processed by multiple thresholds to provide multiple binary images per each aerial images. Each binary image is generated by applying a single threshold (or a printability threshold function) on an aerial image.

The different thresholds can be selected based on the printability threshold of the photoresist and may also be responsive to the intensity of the illumination (applied during the lithography process). Thus, changes at the intensity can be translated to equivalent changes in the printability threshold.

Method 100 may also stage 130 of applying a metrology process on a Focus Exposure Matrix (FEM) wafer that was manufactured using an initial set of focus and exposure values. This initial set of values is usually based upon Bossung curves that were found to be inadequate for two dimensional patterning and not adequate for very small features. (see: "Defect window analysis by using SEM-contour-based shape quantifying method for sub-20 nm node production", Daisuke Hibino; Mingyi Hsu; Hiroyuki Shindo; Masayuki Izawa; Yuji Enomoto; J. F. Lin; J. R. Hu, Proc. SPIE, Metrology, Inspection, and Process Control for Microlithography XXVII, 86810B (Apr. 10, 2013); doi: 10.1117/12.2010780).

The initial set of points lack mask inspection databased guidance, indifferent to 2D patterning originated weak points.

Stages 120 and 130 are followed by stage 140 of determining focus and exposure values for generating a Process Window Qualification (PWQ) wafer to be manufactured using the mask in response to focus and exposure values associated with weak points and, optionally, in response to metrology results of FEM matrix. The PWQ wafer includes multiple dies that differ from each other by their manufacturing parameters (values of focus and exposure). One die is manufactured at the optimal/nominal manufacturing parameters and other dies are manufactured by other manufacturing parameters thereby allowing an inspection system to compare (for example by die to die comparison) between dies manufactured at different focus and exposure values to the nominal die.

The pairs of focus and exposure points selected for the different dies of the PWQ wafer may include more pairs of focus and exposure values that are allocated at pairs of focus and exposure values associated with weak points or at least near such pairs of focus and exposure values.

Stage 140 may be followed by stages 150 and 160.

Stage 150 may include determining inspection and/or review recipes in view of the weak points.

Stage 150 may include, for example, inspecting weak areas and their vicinity at higher sensitivity that other areas. This may provide a good tradeoff between throughput and sensitivity.

Stage 150 may be followed by stage 160.

Stage 160 may include inspecting the PWQ wafer to provide PWQ inspection results.

Stage 160 may be followed by stage 170 of responding to the inspection results of the PWQ wafer.

Stage 170 of responding 170 may include at least one of the following steps:
  a. Step 171 of selecting suspected defects to be reviewed out of all the suspected defects that were detected during the PWQ inspection.
  b. Step 172 of reviewing at least some of the suspected defects detected during the PWQ inspection results. This may include selecting suspected defects to be reviewed out of a larger number of suspected defects found during the inspection. The selection criterion may include selecting suspected defects associated with weak points, selected unclassified defects, and the like.
  c. Step 173 of updating weak points information. This may include providing a map of current weak points. Additionally or alternatively this may include providing weak points to be examined by the next PWQ wafer.
  d. Step 174 of classifying defects found during the review.
  e. Step 175 of updating inspection and/or review recipe and/or weak point analysis recipe (thresholds, number of focus planes and the like), in view of the inspection results and/or the review results
  f. Step 176 of determining focus and exposure values for generating the next PWQ wafer.
  g. Step 177 of evaluating the state of the mask. This may include determining if the mask should be repaired, should be replaced or is in a satisfactory condition.
  h. Step 178 of scheduling the manufacturing of the next PWQ wafer. The timing of the manufacturing of the next PWQ wafer can be responsive to the state of the mask, to the criticality of the actual weak points, and the like.
  i. Step 179 of generating process window information indicative of a desired process window to be used in downstream production.

Figure 2:
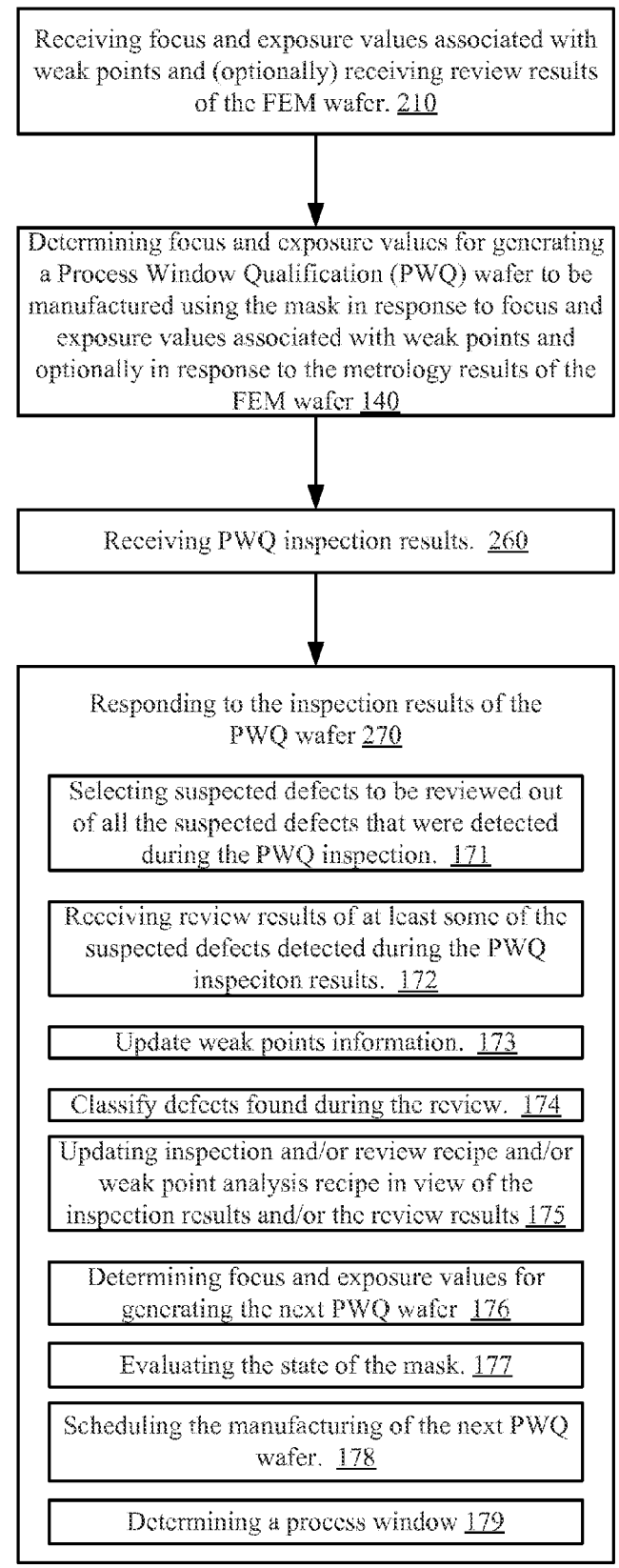

FIG. 2 illustrates method 200 according to an embodiment of the invention.

Method 200 may start by stage 210 of receiving focus and exposure values associated with weak points and, optionally, receiving metrology results of a FEM wafer.

Stage 210 may be followed by stage 140 of determining focus and exposure values for generating a Process Window Qualification (PWQ) wafer to be manufactured using the mask in response to focus and exposure values associated with weak points and, optionally, in response to metrology results of FEM wafer.

Stage 140 may be followed by stage 260 of receiving inspection results of the PWQ wafer (PWQ inspection results).

Stage 260 may be followed by stage 270 of responding to the PWQ inspection results.

The responding (270) may include at least one of the following steps:
  a. Selecting (171) suspected defects to be reviewed out of all the suspected defects that were detected during the PWQ inspection.
  b. Receiving (272) review results of at least some of the suspected defects detected during the PWQ inspection results.
  c. Updating (173) weak points to be examined by the next PWQ wafer.
  d. Classifying (174) defects found during the review.
  e. Updating (175) inspection and/or review recipe and/or weak point analysis recipe in view of the inspection results and/or the review results.
  f. Determining window map and hot-spot list to be used downstream in production or focus and exposure values for generating the next PWQ wafer (176).
  g. Scheduling (178) the manufacturing of the next PWQ wafer. The timing of the manufacturing of the next PWQ wafer can be responsive to the state of the mask, to the criticality of the actual weak points, and the like.
  h. Generating (179) process window information indicative of a desired process window to be used in downstream production.

Figure 3:
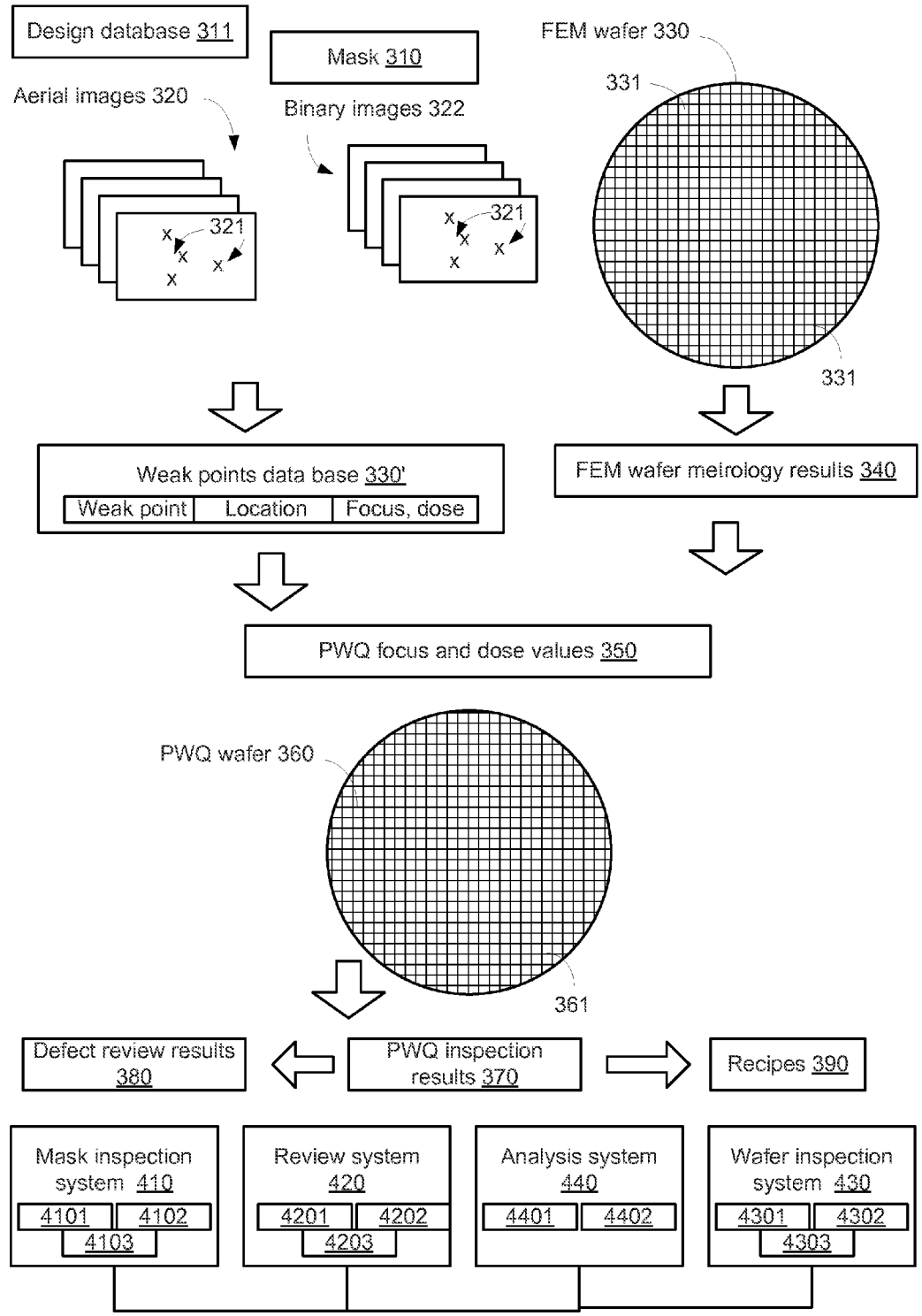
FIG. 3 illustrates systems, data structures and wafers according to various embodiments of the invention.

FIG. 3 illustrates data structures and systems according to various embodiments of the invention.

Especially, FIG. 3 illustrates:
  a. Mask 310.
  b. Design database 311 (a.k.a. as CAD DB) of the mask and the wafer.
  c. FEM wafer 330 that includes multiple FEM dies 331.
  d. Aerial images 320 of the mask 310 or an area of the mask, the aerial images 320 were obtained at different focus values and include weak points such as weak points 321. One or more of these aerial images may be processed to provide binary images 322.

e. Weak points database 330' that includes, for each weak point, its coordinates (location) and the focus and dose values associated with it.

f. FEM wafer metrology results 340.

g. PWQ focus and dose values 350.

h. PWQ wafer 360 having various dies.

i. PWQ inspection results 370.

j. Defect review results 380.

k. Recipes 390 that may include inspection system recipes, review system recipes, weak point recipe, and the like.

l. Mask inspection system 410 that may include a processor 4101, memory module 4102 and optics 4103. Mask inspection system 410 may actually acquire aerial images 320 (actual aerial images) or other non-aerial images based on which the aerial images will be calculated (calculated aerial images).

m. Review system 420 that may include processor 4201, memory module 4202 and optics or electron-optics 4203. Review system 420 may generate defect review results 380. It may be a scanning electron microscope.

n. Wafer inspection system 430 that includes a processor 4301, memory module 4302 and optics 4303.

o. Analysis system 440 that includes processor 4401 and memory module 4402. Analysis system 440 may determine the PWQ focus and dose values 350, may update recipes 390, may determine the window map and hot-spot list to be used downstream in production, and the like.

Metrology results of the FEM wafer can be provided by the review system or a metrology system (such as a critical dimension scanning electron microscope CD-SEM).

Mask inspection system 410, review system 420, wafer inspection system 430 and analysis system 440 may cooperate in order to execute methods 100 and 200.

For example, analysis system 440 may be a stand-alone system, may be located at a remote site, and may be integrated with at least one of mask inspection system 410, review system 420, and wafer inspection system 430.

Analysis system 440 may, for example, execute stage 140, stage 150 and stage 170 of method 100, as well as stage 210, stage 140, stage 260 and stage 270 of method 200. Mask inspection system 410 may execute, for example, stage 110 and stage 120 of method 100. Wafer inspection system 430 may execute stage 130 of method 100. Review system 420 may execute stage 152 and stage 154 of method 100.

Weak Points

Weak points are locations on the aerial image (traceable to the mask) that are at a higher than desired risk of being misprinted. There can be many types of weak points. The following description provides a definition of how weak points can be defined and located.

Suspected weak points (locations to be searched for weak points) can be obtained based on Computer Aided Design (CAD) information, based on mask errors detected in the past, evaluation of other masks, and the like. Suspected weak points can include, for example, thin patterns, patterns that are proximate to each other, edges of an elongated line, and the like.

The weak points can be searched by processing the entire aerial images, or concentrating on suspected weak points, or both.

It is noted that a weak point can include a single pixel or a group of pixels.

Extra Pattern

One type of weak point is an extra pattern—a point (pixel or a group of pixels) of an aerial image of an area of the mask (that area can include the entire mask or only portions of the mask) that is at risk of printing on wafer where it is not intended to.

More specifically, this location is at high risk of:

a. Positive resist: passing above printability threshold, where it was not intended to.

b. Negative resist: dropping below printability threshold, where it was not intended to.

This weak point can be located in the aerial image by identifying locations that have:

a. Positive resist: a maxima close and below the printability threshold.

b. Negative resist: a minima close and above the printability threshold.

The distance of the local extremum (maxima/minima) from the printability threshold can be used as significance metric. The maxima and minima can be identified by calculating first derivatives in X and Y directions and looking for zero (or close to zero) values of the derivatives.

$$\frac{\partial I(x0, y0)}{\partial X} \approx 0; \frac{\partial I(x0, y0)}{\partial Y} \approx 0$$

Minimum/Maximum can be determined using the second derivative test.

The lithography process can exhibit a process window of allowable lithography process conditions (such as focus and intensity). Different allowable lithography process conditions may introduce allowable changes at pixels of the expected image to be imprinted on the photoresist. These allowable changes should be smaller than an intensity threshold that can be determined based on the process window. Wider process window (more tolerable to changes) will result in higher intensity thresholds.

According to an embodiment of the invention a suspected extra pattern weak point is identified as a weak point if the intensity distance between the printability threshold and the suspected extra pattern weak point does not exceed the intensity threshold. According to an embodiment of the invention an extra "safety distance" can be defined so that the extra pattern is defined as a weak point if the distance between the printability threshold and the extra pattern does not exceed a sum of (a) the intensity threshold and (b) the safety distance.

The safety distance can be set in an arbitrary manner or can be set according to an expected future degradation of the mask over time.

Figure 4:
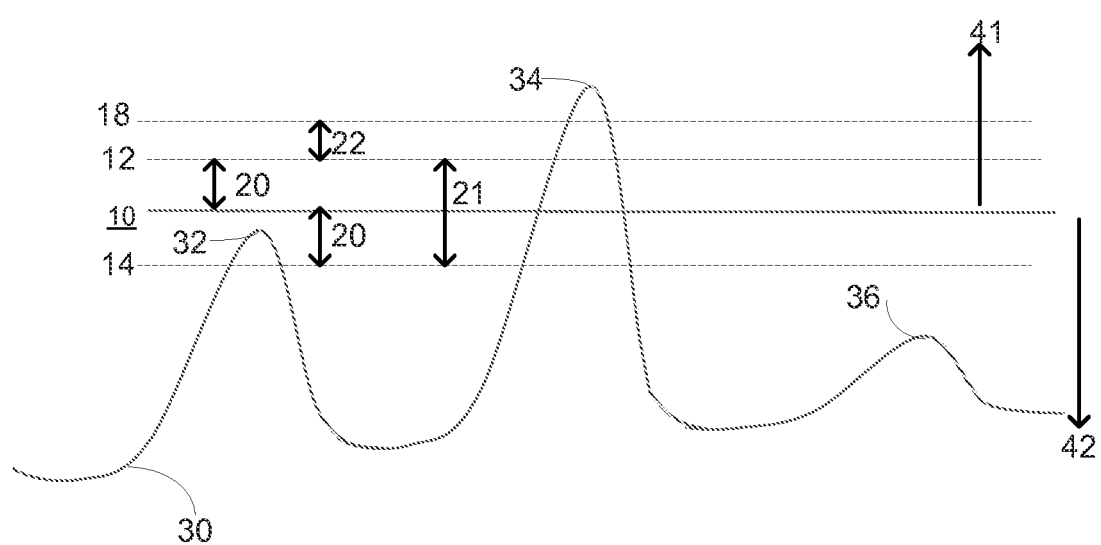
FIGS. 4-8 illustrate various weak points according to various embodiments of the invention.

FIG. 4 illustrates a curve 30 which illustrates the intensity (gray level) of pixels of a line of an aerial image of an area of a mask. The curve 30 has three local maximum points (local maximum points) denoted 32, 34 and 36.

FIG. 4 also illustrates a printability threshold 10, an upper threshold 12 and a lower threshold 14. The process window of the lithography process can change the intensities of pixels of the aerial image in a manner that is equivalent to a virtual change of the printability threshold 10 between upper threshold 12 and lower threshold 14.

Figure 5:
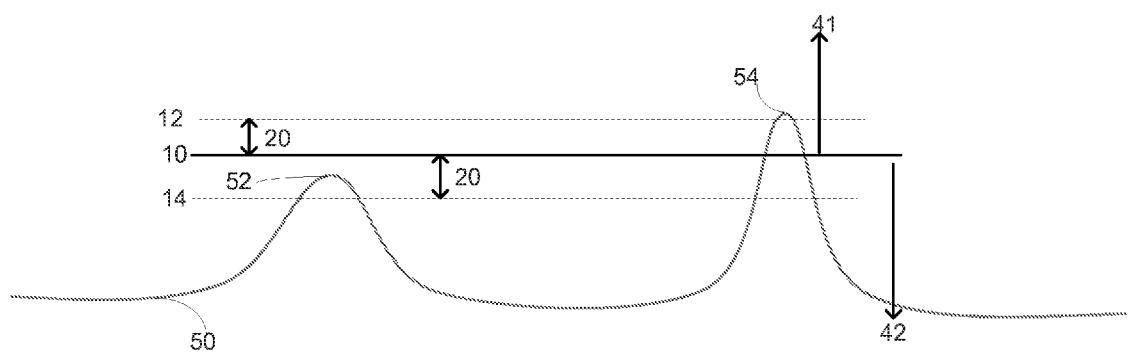

In FIG. 5 arrow 41 represents a virtual increment of the printability threshold 10. Arrow 42 represents a virtual decrement of printability threshold 10.

Different allowable lithography process conditions introduce allowable changes at pixels of the expected image and these allowable changes do not exceed an intensity threshold 20 between the printability threshold 10 and each of the upper threshold 12 and the lower threshold 14.

Local maximum point 34 and local maximum point 36 are located outside a region that is delimited by the upper threshold 12 and lower threshold 14 and thus allowable changes of the lithography process conditions within the process window will not cause these local maximum points to change their side—local maximum point 34 will remain above the printability threshold regardless of allowable lithography process condition changes and local maximum point 36 will remain below the printability threshold regardless of allowable lithography process changes.

Local maximum point 32 is located below the printability threshold 10 but above the upper threshold 12—thus allowable lithography process condition changes can cause local maximum point 32 to be located above the printability threshold 10. If the photoresist is a positive photoresist then local maximum point 32 and the feature that includes local maximum point 32 may appear due to allowable lithography process condition changes—and local maximum point 32 should be considered a weak point.

FIG. 4 also illustrates another upper threshold 18 that is positioned above upper threshold 12.

Other upper threshold 18 is spaced apart from the printability threshold 10 by a (a) the intensity threshold 20 and (b) safety distance 22.

Upper threshold 12 and lower threshold 21 are spaced apart by distance 21.

According to an embodiment of the inventions local maximum points located between the printability threshold 10 and the other upper threshold 18 may be regarded as weak points. It is noted that an equivalent threshold can be positioned below the lower threshold 14.

It is further noted that because all local minimum points of the curve 30 are located outside the different thresholds they are not weak points.

Bridge

A bridge is a location on the aerial image that is at risk of connecting features on the wafer that are not intended to be connected. More specifically, this location is at high risk of:
  a. Positive resist: passing above printability threshold connecting two different regions that are above printability threshold by design.
  b. Negative resist: dropping below printability threshold connecting two different regions that are below printability threshold by design.

This weak point can be located in the aerial image by identifying locations that have:
  a. Positive resist: a maxima close and below the printability threshold.
  b. Negative resist: a minima close and above the printability threshold.

The distance of the maxima/minima from the printability threshold can be used as significance metric. The maxima and minima can be identified by calculating first derivatives in X and Y directions and looking for zero (or close to zero) values of the derivatives.

$$\frac{\partial I(x0, y0)}{\partial X} \approx 0; \frac{\partial I(x0, y0)}{\partial Y} \approx 0$$

Minimum/Maximum can be determined using the second derivative test.

FIG. 5 illustrates a curve 50 which illustrates the intensity (gray level) of pixels of a line of an aerial image of an area of a mask. The curve 50 has local maximum point 54 and local maximum point 52.

FIG. 5 also illustrates printability threshold 10, an upper threshold 12 and a lower threshold 14.

There is an intensity threshold 20 between the printability threshold 10 and each of the upper threshold 12 and the lower threshold 14.

In FIG. 5 arrow 41 represents a virtual increment of the printability threshold 10. Arrow 42 represents a virtual decrement of printability threshold 10.

Local maximum point 54 is located outside a region that is delimited by the upper threshold 12 and lower threshold 14 and thus allowable changes of the lithography process conditions within the process window will not cause this local maximum point to change its side—local maximum point 54 will remain above the printability threshold regardless of allowable lithography process condition changes.

Local maximum point 52 is located slightly above the printability threshold 10 but below the upper threshold 12—thus allowable lithography process condition changes can cause local maximum point 52 to be located below the printability threshold 10. If the photoresist is a negative photoresist then local maximum point 52 may be printed and bridge between two separated by design features due to allowable lithography process condition changes—and it should be considered a weak point.

For simplicity of explanation FIG. 5 does not illustrate additional thresholds that may be defined such as to include a safety distance.

It is further noted that because all local minimum and maximum points of the curve 50 are located outside the different thresholds they are not weak points.

Disconnect

A Disconnect weak point is a location on the Aerial that is at risk of not printing on the wafer segmenting a feature that is continuous by design. More specifically, this location is at high risk of:
  a. Positive resist: dropping below printability threshold breaking a continuous region that is above printability threshold by design.
  b. Negative resist: passing above printability threshold breaking a continuous region that is below printability threshold by design.

This point can be located in the aerial image by identifying locations that have:
  a. Positive resist: a minima close and above the printability threshold.
  b. Negative resist: a maxima close and below the printability threshold.

The distance of the maxima/minima from the printability threshold can be used as significance metric. The maxima and minima can be identified by calculating first derivatives in X and Y directions and looking for zero (or close to zero) values of the derivatives.

$$\frac{\partial I(x0, y0)}{\partial X} \approx 0; \frac{\partial I(x0, y0)}{\partial Y} \approx 0$$

Minimum/Maximum can be determined using the second derivative test.

Figure 6:
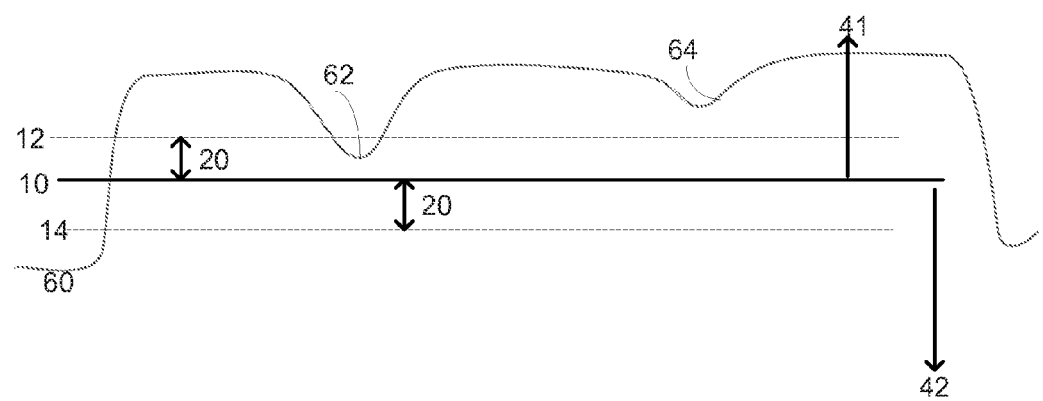

FIG. 6 illustrates a curve 60 which illustrates the intensity (gray level) of pixels of a line of an aerial image of an area of a mask.

In FIG. 6 there is an intensity threshold 20 between the printability threshold 10 and each of the upper threshold 12 and the lower threshold 14. Arrow 41 represents a virtual increment of the printability threshold 10. Arrow 42 represents a virtual decrement of printability threshold 10.

Assuming that the photoresist is a positive photoresist then the curve 60 should represents a single pattern (for example—it can represent a cross section of a line). Curve 60 has local minimum point 62 and local minimum point 64.

Allowable changes of the lithography process conditions within the process window will not cause local minimum point 64 to change it side—local minimum point 64 will remain above the printability threshold regardless of allowable lithography process condition changes.

Local minimum point 62 is located within a region that is delimited by the upper threshold 12 and lower threshold 14 and allowable lithography process condition changes can cause the local minimum point 62 to be located below the printability threshold 10 and cause a discontinuity at the pattern represented by curve 60. Thus—local minimum point should be considered a weak point.

For simplicity of explanation FIG. 6 does not illustrate additional thresholds that may be defined such as to include a safety distance.

It is further noted that because all local minimum points of the curve 60 are located outside the different thresholds they are not weak points.

"High MEEF"

A "high MEEF" weak point is a location on the Aerial that is highly sensitive to small changes on the mask leading to high sensitivity of the printed feature CD to small changes on the mask. More specifically small changes on the mask significantly increase/decrease the regions above/below the printability threshold.

This point can be located in the aerial image by identifying locations that have shallow slope around the printability threshold leading to high CD change (typically measured in percent of nominal CD) over small changes in printing conditions.

The slope value at the printability threshold crossing can be used as a point weakness metric.

Operatively the "High MEEF" WP can be identified by spotting locations that satisfy:

$$\frac{\partial I(x_{pt}, y_{pt})}{\partial X} < \varepsilon; \frac{\partial I(x_{pt}, y_{pt})}{\partial Y} < \varepsilon$$

Wherein the point (Xpt, Ypt) is a crossing point of the printability threshold.

Figure 7:
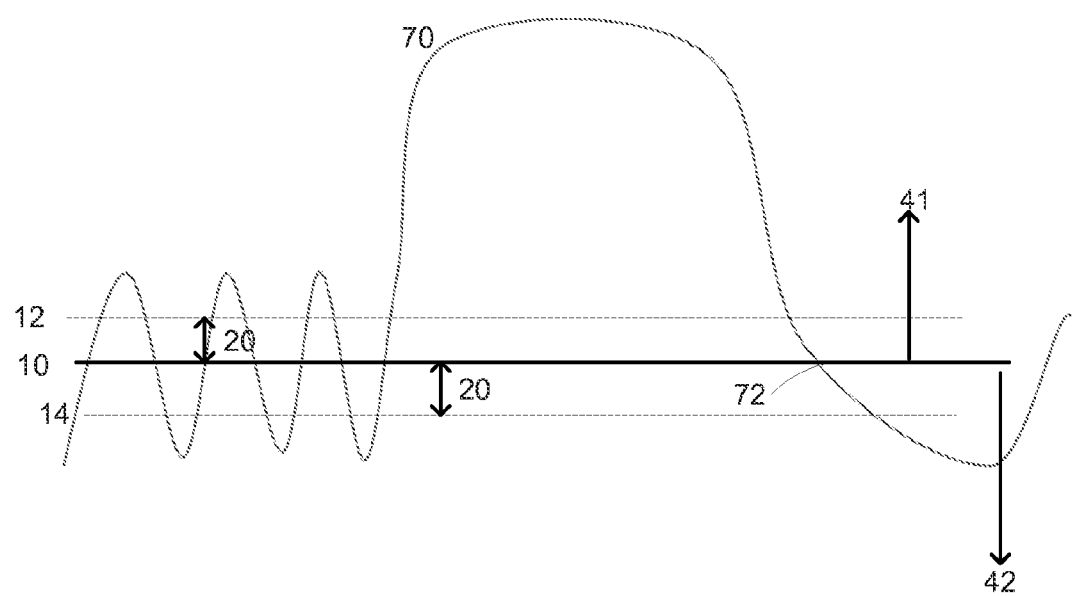

FIG. 7 illustrates a curve 70 which illustrates the intensity (gray level) of pixels of a line of an aerial image of an area of a mask. Assuming that the photoresist is a positive photoresist then the right end of the curve can represent an end of a line.

In FIG. 7 there is an intensity threshold 20 between the printability threshold 10 and each of the upper threshold 12 and the lower threshold 14. Arrow 41 represents a virtual increment of the printability threshold 10. Arrow 42 represents a virtual decrement of printability threshold 10

A crossing point 72 of the printability threshold 10 is included in a portion of the curve 70 that has a slope than is lower than a desired slope—thus allowable changes in the lithography process conditions (equivalent to vertical movements of the printability threshold) will result in relatively large variations of the width of the line represented by the right portion of curve 70. Thus—crossing point 72 should be regarded as a weak point.

Figure 8:
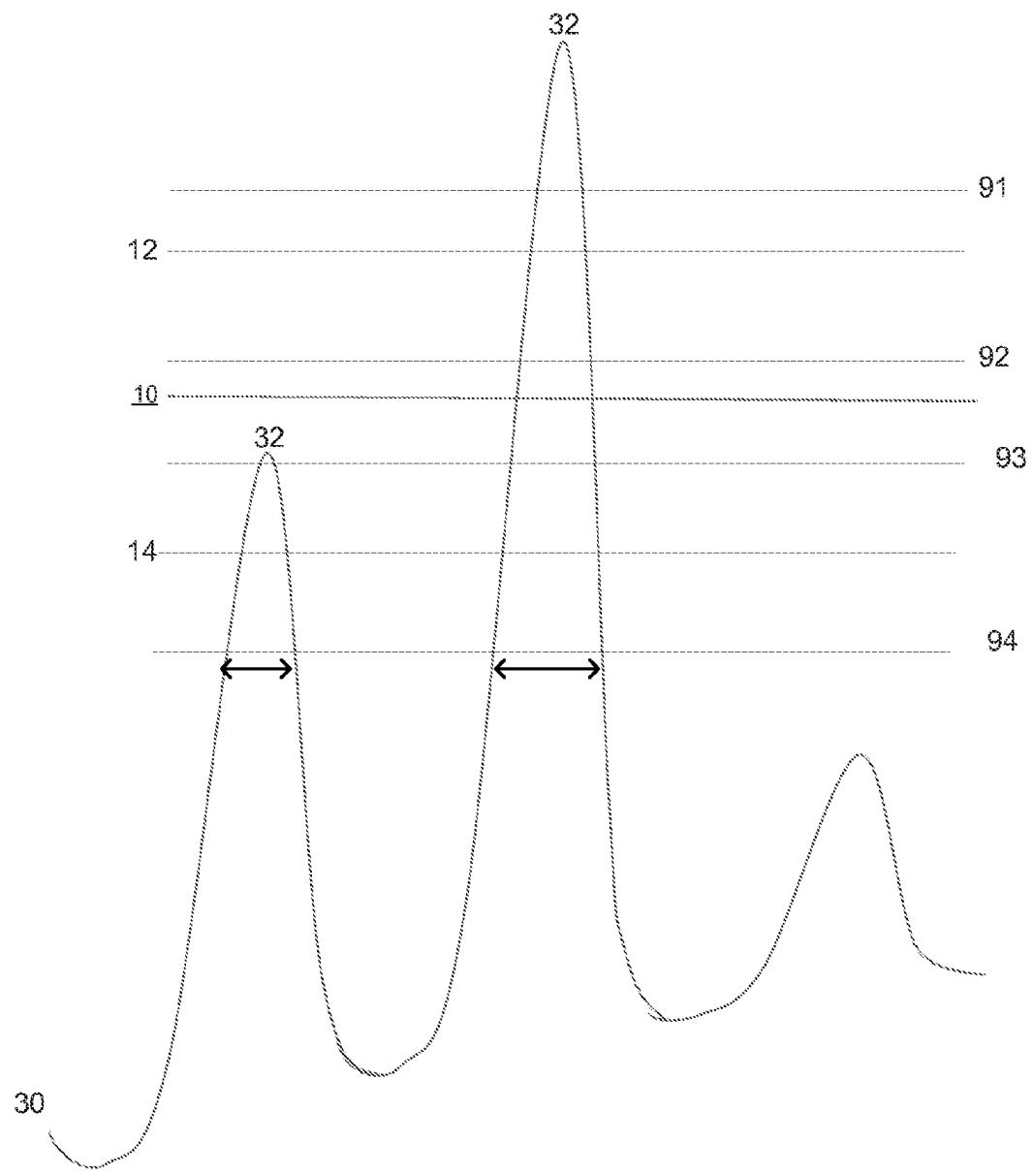

FIG. 8 illustrates a curve 30 that includes local maximum point 32, local maximum point 34 and local maximum point 36, printability threshold 10, an upper threshold 12 and a lower threshold 14 that are defined based on changes that may be introduced by different allowable lithography process conditions within an allowed process window.

In FIG. 8 there is an intensity threshold 20 between the printability threshold 10 and each of the upper threshold 12 and the lower threshold 14. Arrow 41 represents a virtual increment of the printability threshold 10. Arrow 42 represents a virtual decrement of printability threshold 10

Upper threshold 92 and lower threshold 93 are located between upper threshold 12 and lower threshold 14. Upper threshold 91 and upper threshold 94 are located outside a region defined by the allowable process window.

Each threshold out of printability threshold 10, upper threshold 12, lower threshold 14, upper threshold 91, upper threshold 92, lower threshold 93 and lower threshold 94 can be used to threshold an aerial image to provide a binary image.

Each threshold can be used to determine what can be an allowed process window—and can be used to update the process window. Attributes such as the width of patterns (see for example arrow 31 and arrow 33 that are indicative of a width of two patterns when lithography process conditions that are associated with additional threshold 94 are applied), a distance between patterns, a distance between a threshold and a local extremum point, a slope of a curve at crossing points, can assist in defining the process window.

The invention was described mainly with reference to the processing of actual aerial images, that were actually obtained by aerial imaging mode. Aerial imaging tool directly generates images that are indicative of the predicted pattern that will be formed on the wafer by a particular arrangements of mask features when undergoing a lithography process. The invention is not limited to the use of actual aerial images. The invention can be implemented by using any known type of image that is indicative of the predicted pattern that will be formed on the wafer by a particular arrangements of mask features when undergoing a lithography process, as known in the art. Specifically, the invention can be implemented based on calculated aerial images that are derived from measurements of non-aerial imaging modes, such as high-resolution modes.

Actual aerial images can be directly obtained at various focus conditions, to thereby give rise to a set of aerial images each corresponding to a focus value out of a set of different focus values. Calculated aerial images may be obtained by a series of images, at multiple imaging conditions (for example: focal planes, Transmitted/Reflected, different illumination settings, etc).

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may cause the storage system to allocate disk drives to disk drive groups.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A non-transitory computer readable medium that stores instructions for:
    obtaining aerial images of an area of a mask, wherein each aerial image corresponds to a focus value out of a set of different focus values;
    finding weak points by processing the aerial images using different printability thresholds;
    determining focus and exposure values associated with the weak points; and
    determining, based on the focus and exposure values associated with the weak points, a plurality of different focus and exposure values associated with a plurality of corresponding different dies of a Process Window Qualification (PWQ) wafer, the PWQ wafer to be manufactured using the mask and the plurality of different focus and exposure values.

2. The non-transitory computer readable medium according to claim 1 that stores instructions for applying a metrology process on a Focus Exposure Matrix (FEM) wafer that was manufactured using an initial set of focus and exposure values; and wherein the determining of the plurality of different focus and exposure values is further based on metrology results of the FEM wafer.

3. The non-transitory computer readable medium according to claim 1 that stores instructions for updating at least one of an inspection recipe or a review recipe in view of at least the weak points.

4. The non-transitory computer readable medium according to claim 1 that stores instructions for inspecting the PWQ wafer to provide PWQ inspection results.

5. The non-transitory computer readable medium according to claim 4 that stores instructions for selecting suspected defects to be reviewed out of all suspected defects that are detected during the PWQ inspection by reviewing the aerial images at locations identified by the PWQ inspection results.

6. The non-transitory computer readable medium according to claim 4 that stores instructions for responding to the PWQ inspection results.

7. The non-transitory computer readable medium according to claim 4 that stores instructions for selecting suspected defects to be reviewed out of all suspected defects that are detected during the PWQ inspection.

8. The non-transitory computer readable medium according to claim 4 that stores instructions for reviewing at least some of suspected defects detected during the PWQ inspection.

9. The non-transitory computer readable medium according to claim 8 that stores instructions for classifying defects found during the reviewing.

10. The non-transitory computer readable medium according to claim 8 that stores instructions for updating at least one of an inspection recipe, a weak point recipe, or a review recipe in view of the reviewing.

11. The non-transitory computer readable medium according to claim 4 that stores instructions for updating weak points to be examined by a next PWQ wafer.

12. The non-transitory computer readable medium according to claim 4 that stores instructions for updating at least one of an inspection recipe, a weak point recipe, or a review recipe in view of the PWQ inspection results.

13. The non-transitory computer readable medium according to claim 4 that stores instructions for determining focus and exposure values for generating a next PWQ wafer.

14. The non-transitory computer readable medium according to claim 1 that stores instructions for evaluating a state of the mask.

15. The non-transitory computer readable medium according to claim 1 that stores instructions for scheduling a manufacturing of a next PWQ wafer.

16. The non-transitory computer readable medium according to claim 1 wherein a printability threshold of a photoresist is defined by a printability function; wherein elements of an expected image that have an intensity that is located at one side of a printability function result in a development of the photoresist; wherein elements of the expected image that have an intensity that is located at a second side of the printability function do not result in a development of the photoresist; wherein a lithography process exhibits a process window of allowable lithography process conditions; wherein different allowable lithography process conditions introduce allowable changes at pixels of the expected image, the allowable changes do not exceed an intensity threshold; and wherein each weak point meets at least one condition out of: (a) being a local extremum point of an aerial image that is spaced apart from the printability function by an intensity difference that does not exceed the intensity threshold; (b) being a crossing point of the printability function and being of a slope that is below a predefined threshold; or (c) rapidly changing intensity through focus.

17. The non-transitory computer readable medium according to claim 16, wherein values of the printability function are location dependent.

18. The non-transitory computer readable medium according to claim 16, wherein each weak point is a local extremum point of the aerial image that is spaced apart from the printability threshold by a distance that does not exceed the intensity threshold.

19. A method for weak point based analysis, the method comprising:
   obtaining, aerial images of an area of a mask, wherein each aerial image corresponds to a focus value out of a set of different focus values;
   finding weak points by processing the aerial images using different printability thresholds;
   determining focus and exposure values associated with the weak points; and
   determining, based on the focus and exposure values associated with the weak points, a plurality of different focus and exposure values associated with a plurality of corresponding different dies of a Process Window Qualification (PWQ) wafer, the PWQ wafer to be manufactured using the mask and the plurality of different focus and exposure values.

20. An analysis system comprising:
   a processor and an memory module;
   wherein the memory module is arranged to store aerial images of an area of a mask, wherein each aerial image corresponds to a focus value out of a set of different focus values;
   wherein the processor is arranged to find weak points by processing the aerial images using different printability thresholds;
   wherein the processor is arranged to determine focus and exposure values associated with the weak points; and
   wherein the processor is arranged to determine, based on the focus and exposure values associated with the weak points, a plurality of different focus and exposure values associated with a plurality of corresponding different dies of a Process Window Qualification (PWQ) wafer, the PWQ wafer to be manufactured using the mask and the plurality of different focus and exposure values.

\* \* \* \* \*